United States Patent [19]

Hansen

[11] 4,321,549
[45] Mar. 23, 1982

[54] SWITCHING QUADRATURE DETECTOR

[75] Inventor: James P. Hansen, Waldorf, Md.

[73] Assignee: The United States of America as represented by the Secretary of the Navy, Washington, D.C.

[21] Appl. No.: 147,413

[22] Filed: May 6, 1980

[51] Int. Cl.³ .............................................. H03D 3/00
[52] U.S. Cl. ..................................... 329/50; 329/112; 329/122; 329/167
[58] Field of Search ................. 329/50, 110, 112, 122, 329/124, 167; 455/214, 337; 375/84, 87; 331/14

[56] References Cited

U.S. PATENT DOCUMENTS 4,119,926 10/1978 Frosch et al. ...................... 331/14 X
4,241,312 12/1980 Barnes et al. .......................... 329/50
4,259,744  3/1981 Junod et al. ....................... 331/14 X

*Primary Examiner*—Siegfried H. Grimm
*Attorney, Agent, or Firm*—Robert F. Beers; William T. Ellis; Philip Schneider

[57] ABSTRACT

A quadrature detector wherein the I and Q quadraturely related signals are produced and processed in the same channel rather than parallel channels. A local oscillator feeds a 90° phase splitter which produces a pair of quadrature signals. These are alternately fed to a balanced modulator for mixing with an input R.F. signal. The sum and difference frequency signals are fed through a low-pass filter which passes only the I and Q difference-frequency signals. These are then separated to provide two output signals corresponding to quadrature components of the input R.F. signal.

5 Claims, 3 Drawing Figures

SWITCHING QUADRATURE DETECTOR

BACKGROUND OF THE INVENTION

This invention relates to quadrature detectors and especially to quadrature detectors in which the quadrature components are processed through the identical R.F. circuit components.

Conventional quadrature detection circuitry (see FIG. 1 of the drawing) utilizes two channels of balanced modulation and low-pass filtering to detect the quadrature components (I and Q components) which fully specify the amplitude and phase of an R.F. signal. An input R.F. signal is first power-split and then mixed with two local oscillator (L.O.) signals which are in phase-quadrature with each other. The modulator outputs are then low-pass-filtered to remove the high-frequency sidebands and the carrier-frequency signals. The amplitude and phase of the original R.F. input are specified by the relations:

$$|\text{Amplitude}| = \sqrt{I^2 + Q^2} \text{ ; Phase} = \tan^{-1}\left(\frac{Q}{I}\right)$$

Since both functions rely on I and Q values, the accuracy of the detection process depends on exact tracking (with respect to input R.F. phase, amplitude and frequency) between the two detection channels. Tracking errors are normally caused by mismatches in the characteristics of the individual R.F. components. These include the balanced modulators, power splitter, and low-pass filter stages. Obviously, to improve the accuracy of the detection process, it is important to reduce or eliminate these mismatches.

SUMMARY OF THE INVENTION

An object of this invention is to eliminate the mismatches which occur in dual-channel quadrature detectors.

Another object is to improve the accuracy of the detection process in quadrature detectors.

A further object is to provide exact tracking as regards R.F. phase, amplitude and frequency between the quadrature signals of a quadrature detector.

These objects and advantages are accomplished by utilizing sampling and multiplexing techniques to permit use of the same circuit components for both the I and Q signals produced by a quadrature detector.

DETAILED DESCRIPTION OF THE INVENTION

Figure 1:
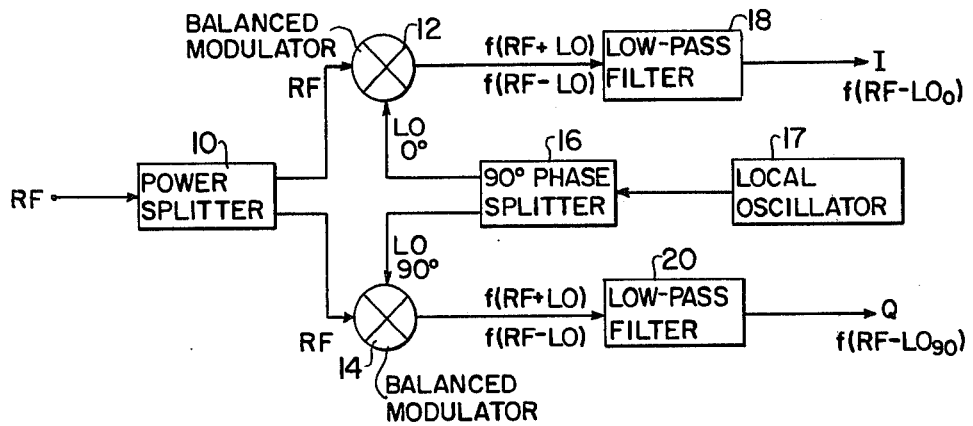
FIG. 1 is a block circuit diagram showing a prior-art quadrature detector.

As can be seen in FIG. 1, a conventional quadrature detector utilizes a power splitter 10 to split an incoming R.F. signal into two parts which are individually fed to a pair of balanced modulators 12 and 14. The signal from a local oscillator (L.O.) 17 is converted by a 90° phase splitter 16 into two signals which are 90° out of phase and which are fed to the balanced modulators. For example, the signal with 0° phase may be fed to modulator 12 and the signal with 90° phase may be fed to modulator 14. Each modulator forms two output signals, one whose frequency is the R.F. frequency plus the L.O. frequency (i.e., f (RF+LO)) and another whose frequency is the R.F. frequency minus the L.O. frequency (i.e., f (RF−LO)). These signals are then fed through low-pass filters 18 and 20, respectively, which remove the higher-frequency signals leaving only the difference-frequency signals, the two difference-signal frequencies being in quadrature phase with each other.

Figure 2:
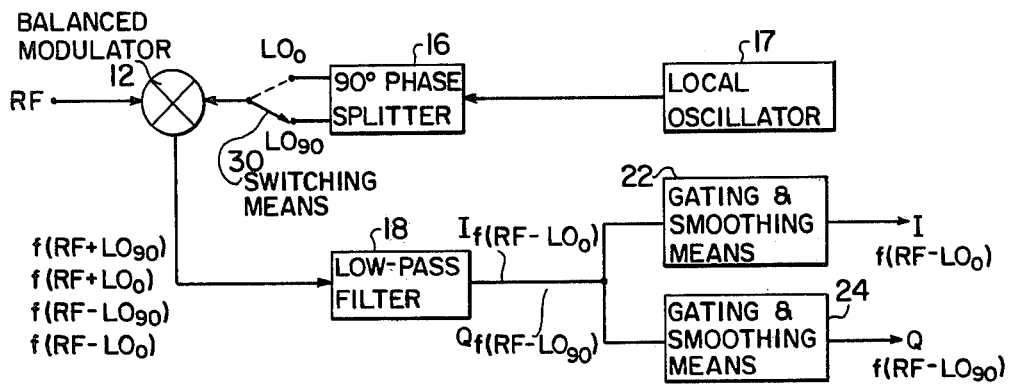
FIG. 2 is a block circuit diagram showing an embodiment of the invention.

A first embodiment of the invention is shown in FIG. 2. The invention places the I and Q signal detection process in one channel by switching the L.O. input phase into a single channel. This configuration eliminates several of the mismatch sources since the I and Q channels now use the same balanced modulator and low-pass filter, and the input power splitter is no longer needed. The L.O. signal must be treated to provide two signals exactly in phase quadrature, but the accuracy of the phasing is no greater than that required by the conventional circuitry.

The output of the L.O. 17 is split by a 90° phase splitter into quadrature signals, denoted by $LO_o$ and $LO_{90}$. The quadrature signals are alternately sampled by a switching, or gating, means 30 and fed to balanced modulator 12 into which the incoming R.F. signal is also coupled. The switching means 30 may be an electronic gating circuit which includes clocking circuitry. The output of the modulator comprises the sum and difference frequency signals of both quadrature signals and the R.F. input signal. The sum-frequency signals are then eliminated by passing the modulator output through the low-pass filter 18. The output of the filter 18 is fed to a pair of gating and smoothing means 22 and 24 which are synchronized with switching means 30, so that gate 22 passes the I signal and gate 24 passes the Q signal (i.e., gate 22 is open when switching means 30 is in the $LO_o$ position and gate 24 is open when switching means 30 is in the $LO_{90}$ position. The output from gating and smoothing means 22 is the I signal at a frequency which is the difference between the frequencies of the RF and LO signals, as is the frequency of the Q signal, but the Q signal is 90° out of phase with the I signal. Both I and Q output signals are analog signals.

The smoothing means may be smoothing filters and are not absolutely necessary but are preferred because they eliminate switching transients in the signals.

The L.O. frequency should be one that is somewhere in the bandwidth of the incoming R.F. signal, preferably in the center of the bandwidth.

The switching rate of switching means 30 can theoretically be fast enough so that a full cycle of the LO signal is fed to the modulator 12. However, it is best to allow switching transients time to die down and therefore the switching rate might have to be slow enough to pass up to about 10 cycles of the LO signal.

Figure 3:
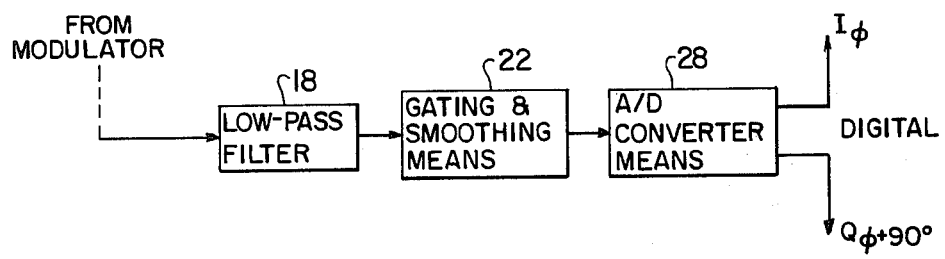
FIG. 3 is a block circuit diagram showing a second embodiment of the invention for use with digital equipment.

A second embodiment of the invention, which is useful where the invention is to be used in conjunction with digital equipment, is shown in FIG. 3. Here the output of the balanced modulator 12 is again passed through the low-pass filter 18. The output of the filter 18 is fed to a gating and smoothing means 22 which may, for example, be a sample-and-hold circuit and the output of the gating means 22 is then fed to an analog-to-digital converter (A/D converter) means 28 which samples the output of the gating means, and converts the sampled amplitudes of the I and Q signals to digital words. The gating means 22 must, of course, be synchronized with the switching times of the switching means 30 and the A/D converter means 28 should also be synchronized with the switching means 30 for the purpose of multiplexing the I and Q digital word outputs to the correct output lines.

The $I_\phi$ and $Q_{\phi+90°}$ symbols merely indicate that the phases of the I and Q signals differ by 90°.

Some important advantages of the present invention over old quadrature detectors are the following:

1. The switching technique allows the same R.F. detection channel to be used for both quadrature detection processes. This eliminates the need to match two channels of R.F. circuitry and insures closer tracking with respect to R.F. input phase, amplitude and frequency.

2. The circuit requires fewer broadband R.F. components (eliminates one balanced modulator, one power splitter, and one low-pass filter).

3. Circuit adjustments such as zeroing of offsets are easier since only one channel is involved.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A quadrature detector for providing a pair of quadrature signals from an R.F. signal input comprising, in combination:

local oscillator (LO) means for providing an A.C. signal;

means, connected to receive the LO output signal as an input, for operating on the LO signal to produce two signals therefrom in quadrature phase with each other, designated the I and the Q signals;

switching means, receiving said I and Q signals as inputs, for alternately providing said I and Q signals as a multiplexed output;

modulator means, receiving said multiplexed I and Q signals and said R.F. input signals as a pair of inputs, for combining said pair of inputs to produce at least four signals, two I signals whose frequencies are the sum and difference of the frequencies of the R.F. and the L.O. in-phase signals, and two signals whose frequencies are the sum and difference of the frequencies of the R.F. and the L.O. quadrature-phase signals;

filter means, receiving the output signals of the modulator means, for passing only the two difference-frequency signals, the two difference-frequency signals being in quadrature with each other; and separation means, connected to receive the output signals of said filter means, for separating the quadrature signals from each other, said quadrature detector being arranged to process the quadrature signals through a single channel up to the point at which they are finally separated from each other to provide the I and Q output signals.

2. A quadrature detector as in claim 1 wherein said filter means is a low-pass filter.

3. A quadrature detector as in claim 1, wherein said modulator means is a balanced modulator.

4. A quadrature detector as in claim 1, wherein said separation means comprises a pair of gating means, one being synchronized to open to pass the I signals from said filter means and the other being synchronized to open to pass the Q signals from said filter means.

5. A quadrature detector as in claim 1, further including A/D converter means connected to receive the output of said separation means, sample the I and Q signals and convert the samples into I and Q digital words denoting the amplitudes of the samples.

* * * * *